United States Patent
Han

(10) Patent No.: US 9,698,363 B1
(45) Date of Patent: Jul. 4, 2017

(54) RF-TRANSISTORS WITH SELF-ALIGNED POINT CONTACTS

(71) Applicant: INTERNATIONAL BUSINESS MACHINES CORPORATION, Armonk, NY (US)

(72) Inventor: Shu-Jen Han, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/983,646

(22) Filed: Dec. 30, 2015

(51) Int. Cl.
*H01L 51/05* (2006.01)
*H01L 51/00* (2006.01)

(52) U.S. Cl.
CPC ...... *H01L 51/0541* (2013.01); *H01L 51/0023* (2013.01); *H01L 51/0026* (2013.01); *H01L 51/0048* (2013.01); *H01L 51/055* (2013.01); *H01L 51/0516* (2013.01)

(58) Field of Classification Search
CPC .............. H01L 51/0558; H01L 29/778; H01L 51/0012; H01L 51/0048; H01L 29/66431; H01L 29/1606; H01L 29/41733; H01L 29/4908; B82Y 10/00
USPC ........................................................ 438/197
See application file for complete search history.

(56) References Cited

U.S. PATENT DOCUMENTS

| | | | |
|---|---|---|---|
| 5,955,759 A | 9/1999 | Ismail et al. | |
| 6,096,590 A | 8/2000 | Chan et al. | |
| 6,159,781 A | 12/2000 | Pan et al. | |
| 7,858,454 B2 | 12/2010 | Kalburge | |
| 8,003,300 B2 | 8/2011 | Jain et al. | |
| 8,692,230 B2 | 4/2014 | Zhou et al. | |
| 9,087,811 B2 | 7/2015 | Guo et al. | |
| 9,147,752 B2 | 9/2015 | Han et al. | |
| 2008/0227259 A1* | 9/2008 | Avouris | B82Y 10/00 438/301 |
| 2012/0056161 A1* | 3/2012 | Avouris | H01L 29/1606 257/24 |
| 2012/0326126 A1* | 12/2012 | Chen | H01L 29/42384 257/29 |
| 2013/0130037 A1* | 5/2013 | Bol | H01L 51/0048 428/408 |
| 2014/0077161 A1 | 3/2014 | Duan et al. | |

OTHER PUBLICATIONS

Wang, Yanjie et al. "Fabrication of Self-Aligned Graphene FETs with Low Fringing Capacitance and Series Resistance," ISRN Electronics, vol. 2012, Article ID 891480, Jul. 23, 2012, pp. 1-8.

* cited by examiner

*Primary Examiner* — Thomas L Dickey
*Assistant Examiner* — Changhyun Yi
(74) *Attorney, Agent, or Firm* — Cantor Colburn LLP; Vazken Alexanian

(57) ABSTRACT

A method of fabricating a semiconductor device includes depositing a dielectric layer on a substrate and a nanomaterial on the dielectric layer. The method also includes depositing a thin metal layer on the nanomaterial and removing a portion of the thin metal layer from a gate area. The method also includes depositing a gate dielectric layer. The method also includes selectively removing the gate dielectric layer from a source contact region and a drain contact region. The method also includes patterning a gate electrode, a source electrode, and a drain electrode.

3 Claims, 10 Drawing Sheets

RF-TRANSISTORS WITH SELF-ALIGNED POINT CONTACTS

BACKGROUND

The present invention relates to transistors, and more specifically, to high performance radio frequency transistors with improved resistance properties.

High performance radio frequency (RF) transistors are sensitive to parasitic resistances. Such parasitic resistances can arise, for example, in a gate region of the (RF) transistors when a portion of gate dielectric region remains exposed after manufacture. Undesired parasitic resistances can significantly reduce the operation frequency of the device.

Carbon nanotubes (CNT) include carbon allotropes that are arranged in a cylindrical nanostructure. Carbon nanotubes have unique semiconducting properties that offer significant performance gains in many semiconducting devices.

Carbon nanotubes may be fabricated using a variety of fabrication processes including, laser ablation, arc discharge, chemical vapor deposition, and plasma torch processes.

Carbon nanotubes, graphene, and related materials have high mobility, making them desirable candidates for RF transistors. However, manufacturing such devices is difficult with existing technologies due to current process limitations. For example, it is difficult to stop at CNT and related materials in reactive ion etching (RIE). Thus, conventional processes for creating self aligned transistors cannot meet applicable design criteria. There remains a need for high performance RF transistors with increased mobility and reduced parasitic resistances.

SUMMARY

According to one embodiment of the disclosure, a method of fabricating a semiconductor device includes depositing a dielectric layer on a substrate. The method also includes depositing a nanomaterial on the dielectric layer. The method also includes depositing a thin metal layer on the nanomaterial. The method also includes removing a portion of the thin metal layer from a gate area. The method also includes depositing a gate dielectric layer. The method also includes selectively removing the gate dielectric layer from a source contact region and a drain contact region. The method also includes patterning a gate electrode, a source electrode, and a drain electrode.

According to another embodiment of the disclosure, a method of forming a semiconductor device includes depositing carbon nanotubes on a substrate. The method also includes depositing a thin nickel layer on the carbon nanotubes. The method also includes selectively removing the thin nickel layer from a gate area of the device. The method also includes forming end bonded contacts between the carbon nanotubes and the thin nickel layer in the gate area of the device.

According to yet another embodiment, a semiconductor device includes a semiconductor substrate. The semiconductor device also includes a thin metal layer on the substrate. The semiconductor device also includes carbon nanotubes. The semiconductor device also includes a T-shaped gate. The semiconductor device also includes an electrode on the substrate and adjacent to the T-gate. In accordance with an embodiment, the carbon nanotubes have end-bonded contact to the thin metal layer on the substrate.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A and 2B illustrate different types of CNT metal contacts, in which:

FIG. 2A illustrates a side-bonded CNT contact and FIG. 2B illustrates an end-bonded CNT contact.

FIGS. 4A-4H illustrate and exemplary method of fabricating a transistor in accordance with an embodiment of the disclosure, in which:

FIG. 4A is a cross sectional side view of an RF transistor after depositing a dielectric layer on a substrate according to an exemplary embodiment;

FIG. 4B is a cross sectional side view of an RF transistor after depositing a nanomaterial on the dielectric layer according to an exemplary embodiment;

FIG. 4C is a cross sectional side view of an RF transistor after depositing a thin metal layer on the nanomaterial according to an exemplary embodiment;

FIG. 4D is a cross sectional side view of an RF transistor after depositing a resist layer on the thin metal layer, patterning the resist layer, and wet etching to remove the thin metal layer from the gate area according to an exemplary embodiment;

FIG. 4E is a cross sectional side view of an RF transistor after depositing a gate dielectric layer and etching the gate dielectric layer to expose the source and drain regions according to an exemplary embodiment;

FIG. 4F is a cross sectional side view of an RF transistor after depositing and patterning a gate electrode, source electrode, and drain electrode on the transistor according to an exemplary embodiment;

FIG. 4G is a cross sectional side view of an RF transistor after conducting an optional low-temperature anneal according to an exemplary embodiment; and FIG. 4H is a cross sectional side view of an RF transistor after removing the resist layer from the transistor according to an exemplary embodiment.

DETAILED DESCRIPTION

The disclosure relates to fabrication of high performance RF transistors with self-aligned point contacts. RF transistors are semiconductor devices can be used in a variety of applications.

Conventional methods of producing RF transistors with CNT and similar 2D materials have suffered from high parasitic resistance. This can be due, for example, to constraints and limitations from conventional transistor fabrication methods, for example, due to scaling.

Conventional semiconductor fabrication methods can result in an undesirably large ungated region on the transistor, in which a portion of gate dielectric remains exposed in the gate area after semiconductor fabrication. This can result in a high parasitic resistance. For example, with respect to length, ungated regions can be 100 nanometers (nm) in length or more.

The semiconductor material under this ungated region cannot be modulated by the gate electrode. Therefore, the semiconductor material under this region remains at high resistive state and introduces large parasitic resistance. The parasitic resistance can effectively reduce the actual bias voltage across source and drain electrodes. This can also significantly reduce the device drive voltage, undesirably leading to much slower switching speed.

Figure 1:
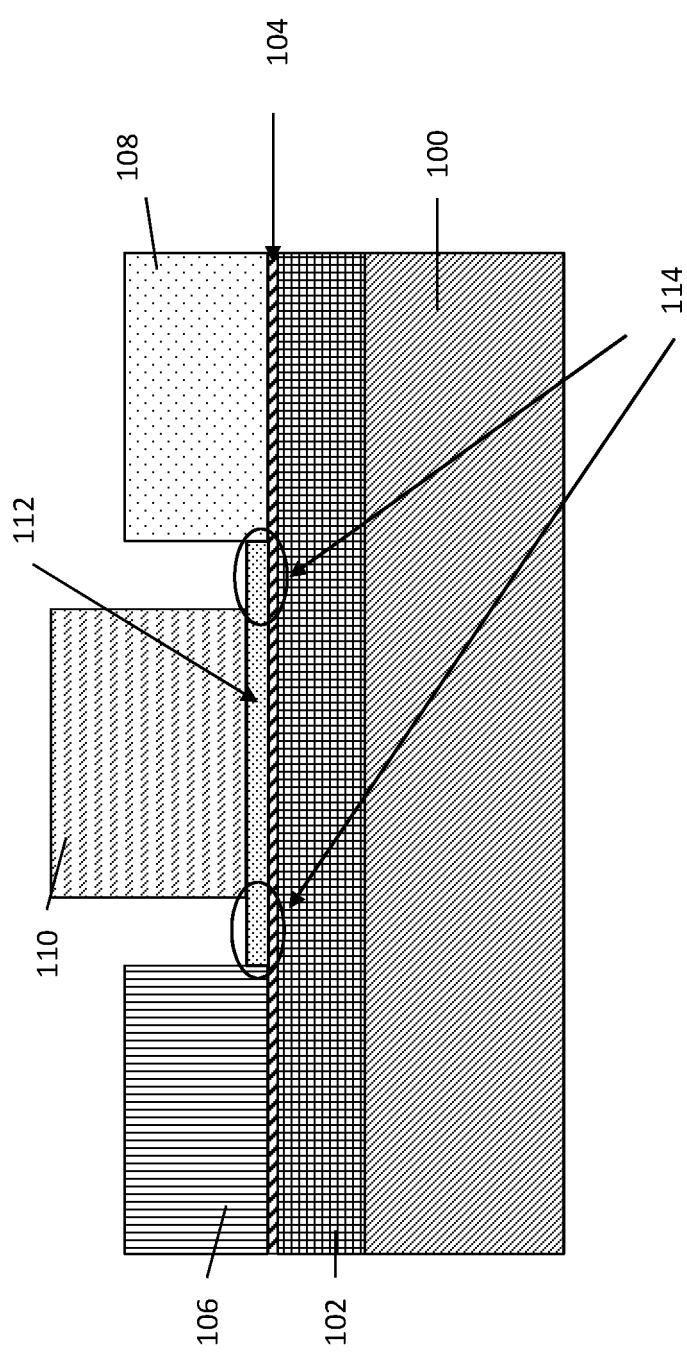
FIG. 1 illustrates a cross sectional view of an exemplary RF transistor incorporating a conducting nanomaterial.

An illustration of an exemplary RF transistor incorporating a conducting nanomaterial is shown in FIG. 1. A dielectric layer 102 is deposited on silicon substrate. A thin layer of conducting nanomaterial 104, such as CNT, or 2D materials such as graphene, can be deposited on the dielectric layer 102. The RF transistor contains a source electrode 106 and a drain electrode 108.

A gate 110 can be positioned between the source electrode 106 and drain electrode 108 and can be positioned on top of a gate dielectric 112. Ungated regions 114 adjacent to the gate 110 result from conventional fabrication techniques and can result in high parasitic resistance. Reducing the size of these regions can be advantageous in high performance applications. However, conventional semiconductor processes to create self aligned structures that might reduce the size of ungated regions in other semiconductor systems, have limited applicability in systems using CNT and similar 2D materials. This can be due to, for example, the difficulty of controlling the stopping point of reactive ion etching (RIE) when using such materials.

Figure 2:
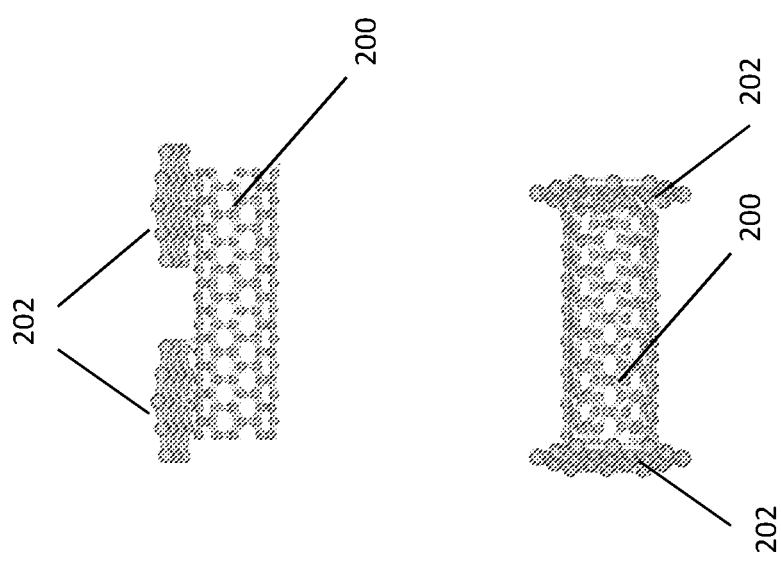

In transistor applications using carbon nanotubes, consideration can be given to the type and/or quality of the CNT contact at the metal interface. The quality of contacts between metal electrode and carbon nanotubes can impact transistor performance. FIGS. 2A and 2B illustrate two different types of CNT-metal contacts.

FIG. 2A depicts a side bonded contact, in which a carbon nanotube 200 contacts a metal 202 on the wall of the tube, or the tube side. Carbon nanotube 200 is a layer of cylindrical tubes formed from carbon atoms. Metal 202, in the case of transistors, can be metal of the source and drain electrodes.

FIG. 2B illustrates a different type of contact between metal and carbon nanotubes, which is an end-bonded contact. In an end-bonded contact, metal 202 contacts the ends of the cylindrical carbon nanotube 200. An end-bonded contact can be preferable in semiconductor applications, for example, because it can form strong covalent bonds between carbon atoms and metal atoms. These bonds can enhance the carrier injection. Reduced resistance could be observed in structures including end-bonded contacts compared to structures including side-bonded contacts.

Figure 3:
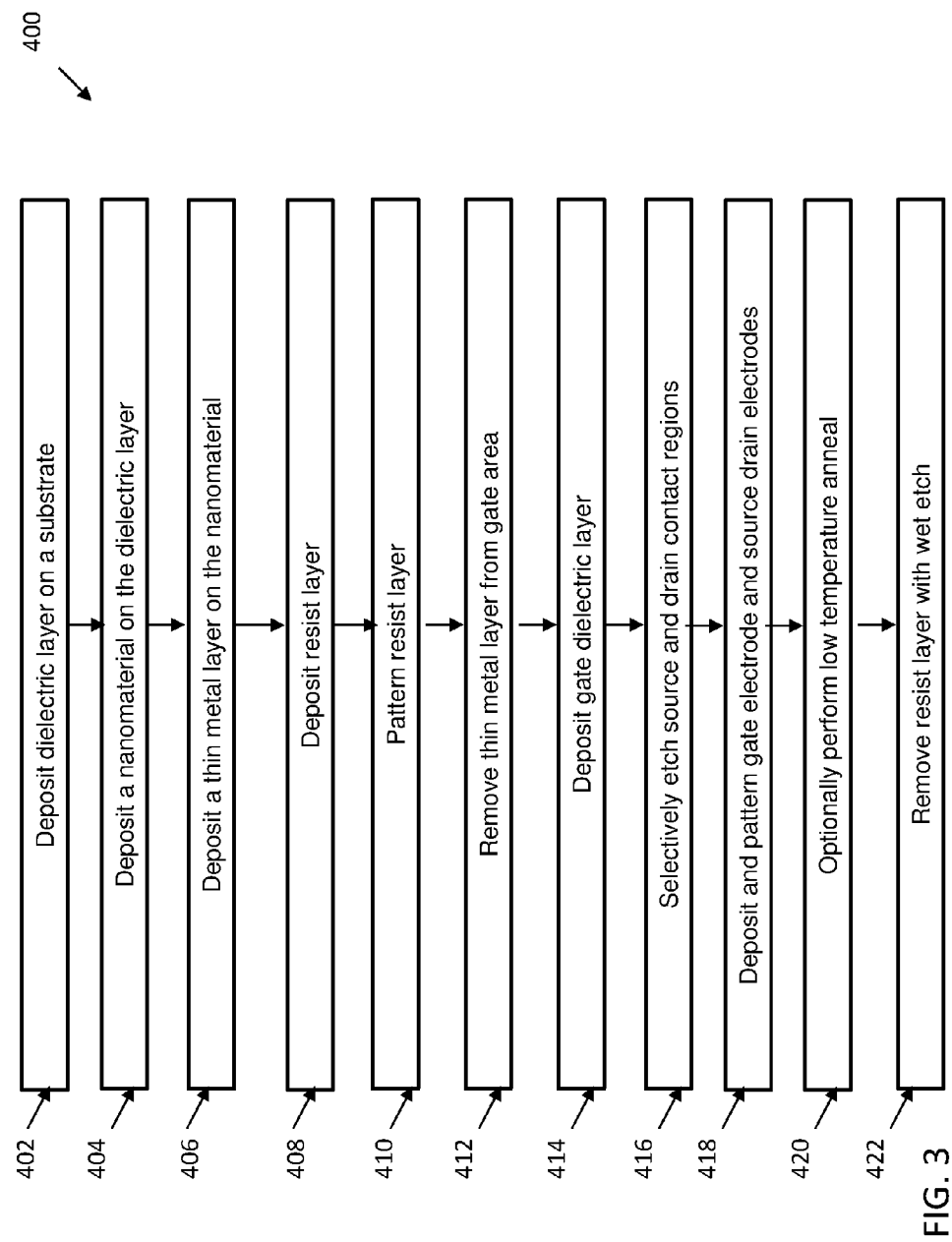
FIG. 3 depicts a flow diagram of a method for preparing a transistor in accordance with an exemplary embodiment of the disclosure.

Referring now to FIG. 3, a flow diagram of a method for preparing a transistor in accordance with an exemplary embodiment is shown. The method 400 includes, as shown at block 402, depositing a dielectric layer on a substrate. Next, as shown at block 404, the method 400 includes depositing a nanomaterial on the dielectric layer. Then, as shown at block 408, a resist layer is deposited.

The method 400 also includes patterning the resist layer, as shown at block 410. Then, as shown at block 412, thin metal layer is selectively removed from the gate area. The method 400 also includes, as shown at block 414, depositing a gate dielectric layer. Next, as shown at block 416, source and drain contact regions are etched to remove the gate dielectric layer.

The method 400 also includes, as shown at block 418 depositing and patterning a gate electrode and source and drain electrodes. The method 400 optionally includes, as shown at block 420, performing a low temperature anneal. Then, as shown at block 422, the method 400 includes removing the resist layer from above the thin metal layer.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

Figure 4A:
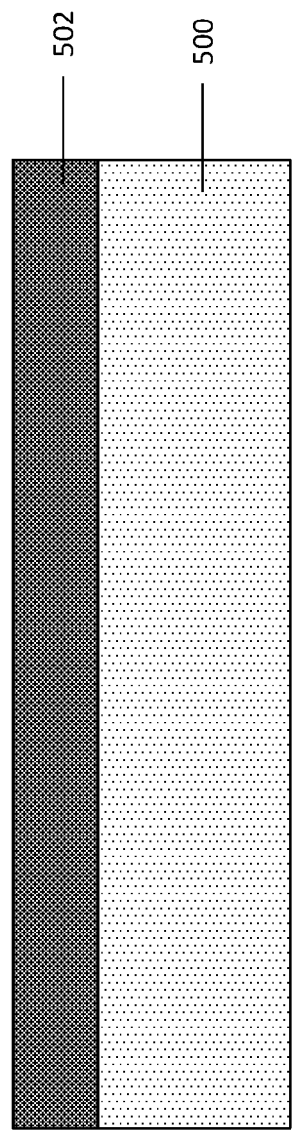

FIGS. 4A-4H illustrate an exemplary method of fabricating a transistor in accordance with one embodiment of the disclosure. As shown in FIG. 4A, a dielectric layer 502 is deposited on a substrate 500.

Substrate 500 can be a semiconductor substrate and can include semiconducting material. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. In preferred embodiments, substrate 500 contains silicon.

The dielectric layer 502 can include any suitable dielectric material. In some embodiments, the dielectric layer 502 is a low-k gate dielectric having a dielectric constant less than 4. Non-limiting examples of suitable materials for the dielectric layer 502 include silicon dioxide, tetraethylorthosilicate (TEOS) oxide, carbon-doped oxides, silicon nitride, high aspect ratio plasma (HARP) oxide, high temperature oxide (HTO), high density plasma (HDP) oxide, oxides (e.g., silicon oxides, hafnium oxides) formed by an atomic layer deposition (ALD) process, or any combination thereof.

Figure 4B:
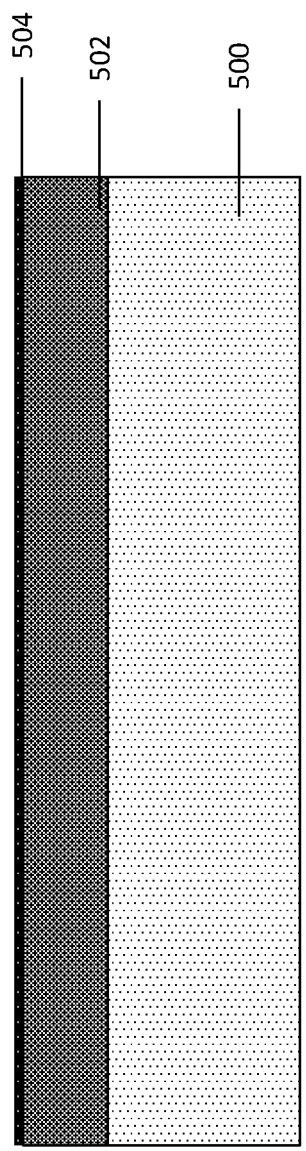

FIG. 4B illustrates the transistor according to an exemplary embodiment after depositing a nanomaterial 504 on the dielectric layer 502. Nanomaterial 504 includes, for example, carbon nanotubes (CNTs), including highly purified CNTs and 2-dimensional (2D) materials, such as graphene or transition metal dichalcogenide (TMDC) materials. In some embodiments, nanomaterials can be doped with other materials.

In some embodiments, the CNTs are highly purified CNTs. For example, in some embodiments, the semiconducting purity of CNT can be at least 90%. For example, in some embodiments, CNT is at least 95% pure. In some embodiments, CNT is at least 96% pure, or at least 97% pure, or at least 98% pure, or at least 99% pure, or 100% pure. Methods of purifying CNT for semiconductor applications are known.

Figures 4C, 4D:
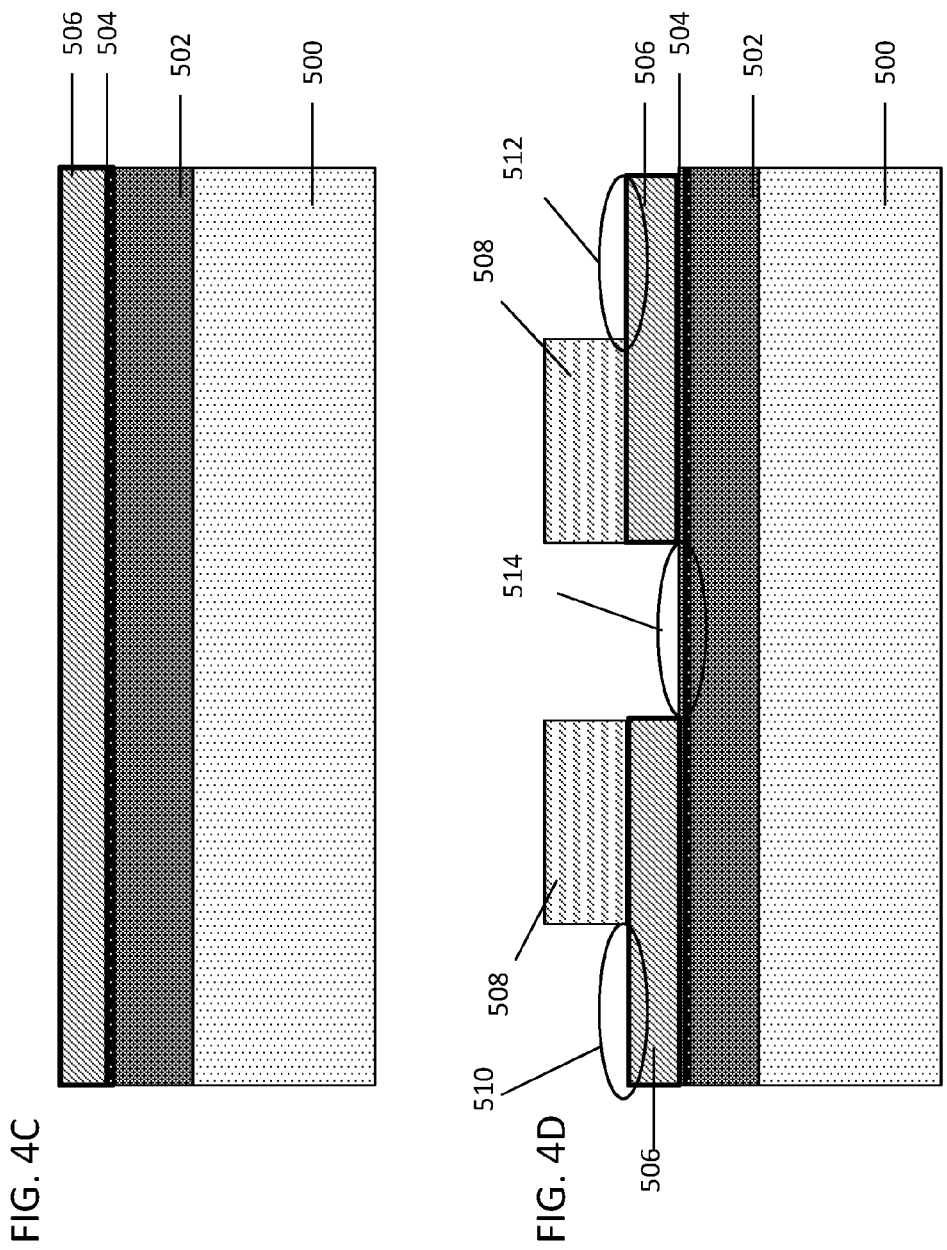

As shown in FIG. 4C, a thin metal layer 506 is deposited on the nanomaterial 504. The thin metal layer 506 can include, for example, nickel (Ni), molybdenum (Mo), palladium (Pd), and other metals suitable in high performance transistors. In some embodiments, the thin metal layer includes nickel.

The thickness of the thin metal layer can be, for example, 5 nm to 50 nm. In some embodiments, the thickness of the thin metal layer is 5 nm to 40 nm. In some embodiments, the thickness of the thin metal layer is 5 nm to 30 nm. In some embodiments, the thickness of the thin metal layer is 5 nm to 20 nm. In some embodiments, the thickness of the thin metal layer is 5 nm to 10 nm.

As illustrated in FIG. 4D, a resist layer 508 is deposited on the thin metal layer 506 and patterned to expose the thin metal layer 506 in the source region 510 and the drain region 512, the regions in which the source and drain electrodes will be formed. Then, as illustrated, the thin metal layer is removed by wet etch in the gate area 514, exposing the nanomaterial 504. If the metal layer is suitably thin, wet etch can be conducted with minimal undercut.

Resist layer 508 can be a photoresist layer such as hydrogen silsesquioxane (HSQ). In preferred embodiments, resist layer 508 is a layer of HSQ. HSQ can be deposited on the thin metal layer and then patterned, for example, by first exposing portions of the HSQ layer (i.e., the portions of the HSQ layer that will remain after the patterning) to an energy-yielding process that will cure and cross-link those portions of the HSQ layer.

For instance, HSQ layer can be cross-linked by exposing the HSQ layer to e-beam or extreme ultraviolet (EUV) radiation with wavelengths shorter than 157 nanometers (nm). Next, unexposed portions of the HSQ layer can then be selectively removed using a developer wash (such as a Tetramethyl-ammonium hydroxide (TMAH) based developer or a salt based developer such as an aqueous mixture of sodium hydroxide (NaOH) alkali and sodium chloride (NaCl) salt) resulting in patterned HSQ.

Figure 4E:
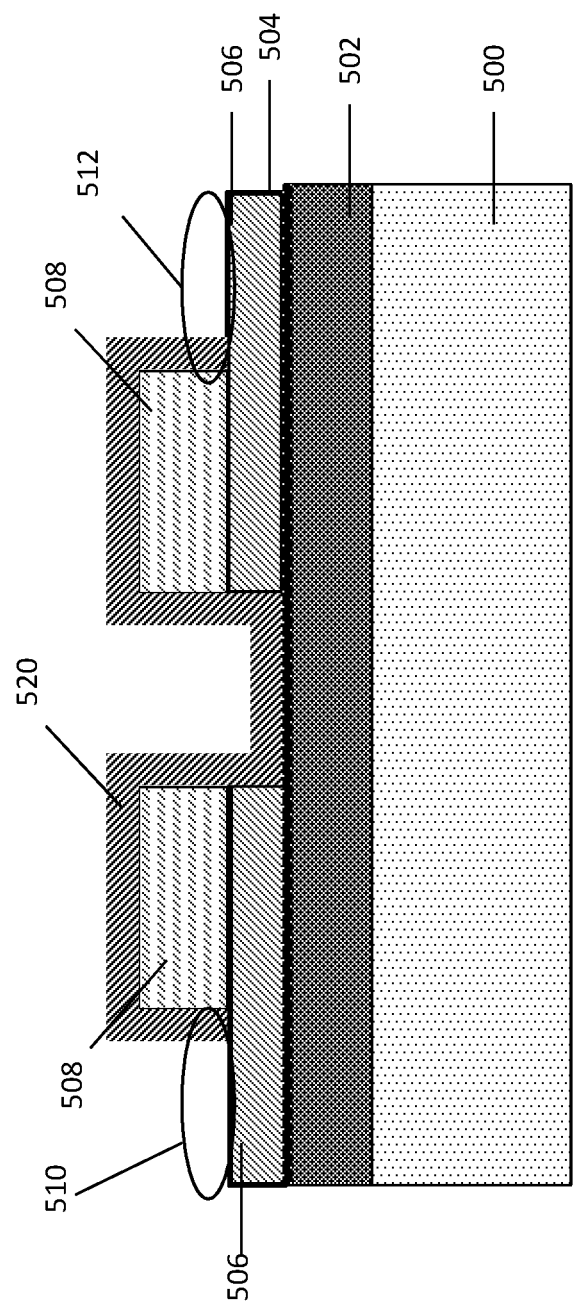

As shown in FIG. 4E, a gate dielectric layer 520 is deposited on the transistor. In some embodiments, gate dielectric layer 520 is deposited by chemical vapor deposition (CVD), plasma-enhanced chemical vapor deposition (PECVD), atomic layer deposition (ALD), evaporation, physical vapor deposition (PVD), chemical solution deposition, or other like processes.

Thereafter, the gate dielectric layer 520 can be etched to expose the thin metal layer 506 in the source region 510 and drain region 512. The gate dielectric layer 520 can be the same material as the dielectric layer or different. Gate dielectric layer 520 includes a material with a high-k dielectric constant.

The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof.

Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

A gate dielectric can be on the order of 10 to 100 Angstroms thick and can include a stacked structure. For example, in some embodiments, a gate dielectric is on the order of 10 to 90 Angstroms thick. In some embodiments, a gate dielectric is on the order of 10 to 80 Angstroms thick. In some embodiments, a gate dielectric is on the order of 10 to 70 Angstroms thick. In some embodiments, a gate dielectric is on the order of 10 to 60 Angstroms thick. In some embodiments, a gate dielectric is on the order of 10 to 50 Angstroms thick.

Figure 4F:
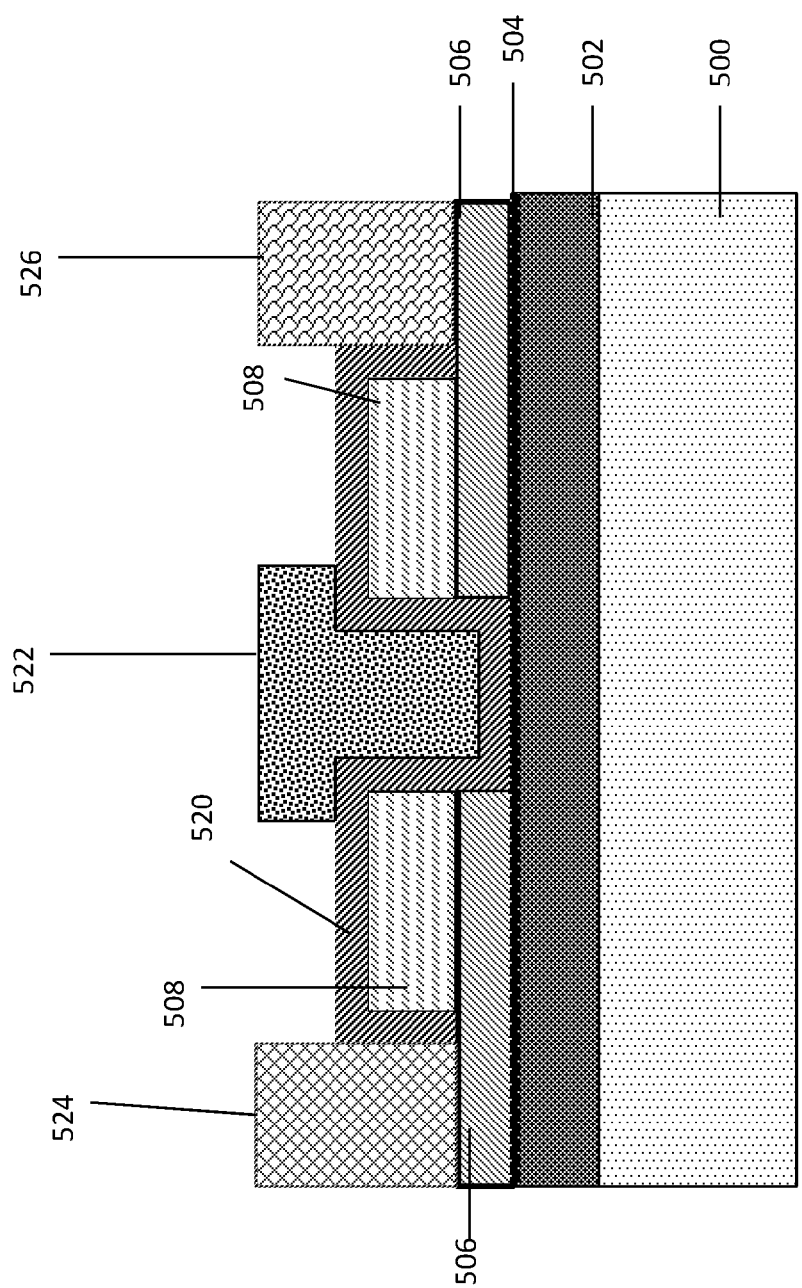

FIG. 4F illustrates the transistor after gate electrode 522, source electrode 524, and drain electrode 526 are deposited and patterned on the transistor. The gate electrode 522, source electrode 524, and drain electrode 526, can be deposited and patterned by any methods known in the art. The deposition and patterning of the gate electrode 522, source electrode 524, and drain electrode 526, can be done in a single step or in more than one step, such as two separate steps.

In some embodiments, the gate electrode 522 can be a T-gate, for example, to lower the gate resistance. Gate electrode 522 can be formed of doped or undoped polysilicon, doped or undoped poly-SiGe, or metal.

Figure 4G:
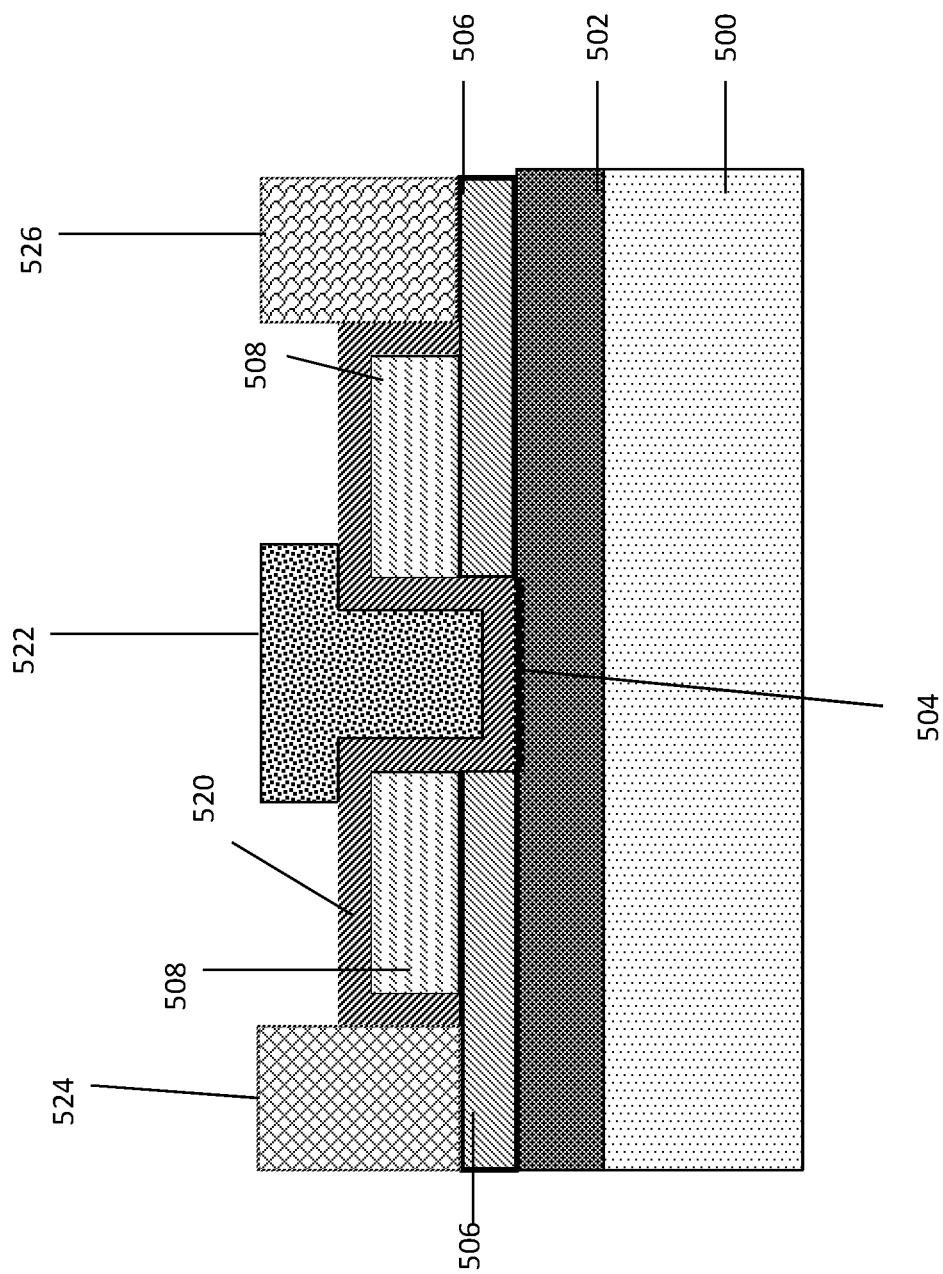

In some embodiments, as shown in FIG. 4G, a low-temperature anneal can be performed. For example, a low temperature anneal can be conducted at a temperature of 400° C. to 500° C. In some embodiments, the low temperature anneal can form end-bonded contacts, such as contacts illustrated in FIG. 2B.

The nanomaterial 504 can contact the thin metal layer 506 at each end of the area containing the gate electrode 522. A low temperature anneal process can be performed by conventional methods known in the art. In some embodiments, an annealing step removes the nanomaterial layer from the top of portions of the thin metal layer. For example, carbon, in the case of graphene, CNT, and related materials, can dissolve into the thin metal layer during the annealing process upon raising the temperature.

Figure 4H:
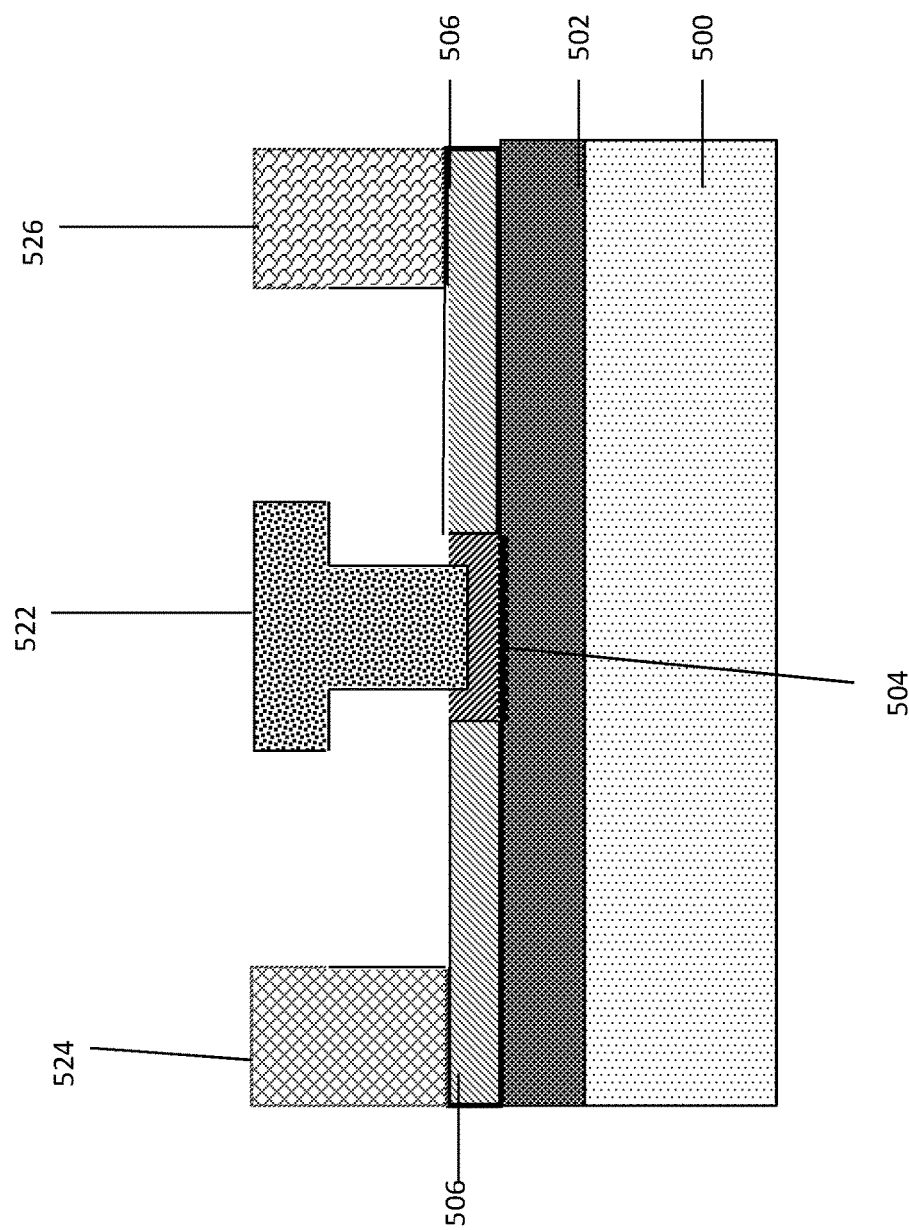

FIG. 4H illustrates the transistor after the resist layer is etched from the transistor, thus exposing the thin metal layer 506 between the source electrode 524 and gate 522 and between the gate 522 and the drain electrode 526. In some embodiments, the gate dielectric remaining on the transistor has a length of less than 10 nm, or in some embodiments, less than 5 nm.

Figure 5:
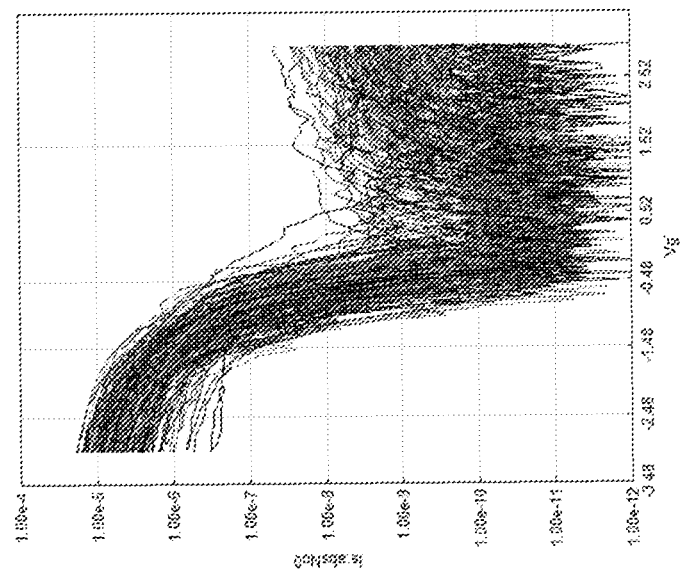
FIG. 5 is a chart illustrating a transfer curve of an RF transistor according to one embodiment of the disclosure.

FIG. 5 depicts an exemplary transfer curve of an embodiment of the disclosure in which a low-temperature anneal at 400° C. was conducted in an exemplary transistor containing a thin Ni layer and carbon nanotube nanomaterial. The y-axis represents the current passing from source to drain, and the x-axis represents a gate electrode voltage. As is shown, with Ni and a low temperature anneal, the present disclosure can provide a device with good transistor activity.

The gate electrode can be any suitable metal. For example, in some embodiments, the gate electrode can include palladium (Pd), aluminum (Al), or gold (Au).

The gate electrode can be formed by either etch process or lift-off process. In etch process, metal can be deposited by ALD, CVD, or PVD to cover the full surface. Then, after covering the surface, standard lithography and etch processes used in semiconductor applications can be used to remove metal and leave T-shaped gate structure as shown in FIG. 4F 522.

In an exemplary lift-off process, the resist layer can be first patterned and developed. Then, after patterning and developing the resist layer, a metal layer can be deposited covering the full surface. Any metal that would not form the final gate structure can be lifted off with resist during a resist removal process.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, the method comprising:
   depositing carbon nanotubes on a substrate,
   depositing a thin nickel layer on the carbon nanotubes,
   selectively removing the thin nickel layer from a gate area of the device, and
   forming end bonded contacts between the carbon nanotubes and the thin nickel layer in the gate area of the device.

2. The method of claim 1, the method further comprising patterning a gate electrode in the gate area of the device.

3. The method of claim 1, the method further comprising patterning a source electrode and a drain electrode on the device.

* * * * *